United States Patent [19]
Arndt et al.

[11] Patent Number: 5,972,724
[45] Date of Patent: *Oct. 26, 1999

[54] PROCESS FOR REDUCING THE SURFACE RECOMBINATION SPEED IN SILICON

[75] Inventors: Wolfgang Arndt; Klaus Graff, both of Heilbronn; Alfons Hamberger, Gundelsheim; Petra Heim, Heilbronn, all of Germany

[73] Assignee: Temic Telefunken microelectronic GmbH, Heilbronn, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/526,556

[22] Filed: Sep. 12, 1995

[30] Foreign Application Priority Data

Sep. 12, 1994 [DE] Germany .............................. 44 32 294

[51] Int. Cl.⁶ .................................................. H01L 21/02
[52] U.S. Cl. .............................. 438/14; 438/17; 438/781; 438/974; 427/10
[58] Field of Search ................................ 437/235, 8, 946, 437/243, 231; 438/17, 14, 781, 780, 782, 974; 427/10, 8

[56] References Cited

U.S. PATENT DOCUMENTS

| | | | |
|---|---|---|---|
| 3,115,424 | 12/1963 | Eannarino | 437/235 |
| 3,684,592 | 8/1972 | Chang et al. . | |
| 3,788,895 | 1/1974 | Schimmer et al. | 437/235 |
| 3,896,254 | 7/1975 | Berkner | 428/411 |
| 4,608,097 | 8/1986 | Weinberger et al. . | |
| 4,683,024 | 7/1987 | Miller et al. | 156/643 |
| 4,806,504 | 2/1989 | Cleeves | 437/228 |
| 4,996,254 | 2/1991 | Eisenbraun et al. | 524/104 |
| 5,262,358 | 11/1993 | Sigmund et al. | 437/235 |
| 5,270,259 | 12/1993 | Ito et al. | 437/231 |
| 5,280,184 | 1/1994 | Jokerst et al. | 257/82 |
| 5,312,512 | 5/1994 | Allman et al. | 437/231 |
| 5,391,507 | 2/1995 | Kwasnick et al. | 437/41 |
| 5,426,058 | 6/1995 | Nakai et al. | 437/231 |
| 5,435,888 | 7/1995 | Kalnitsky et al. | 437/231 |
| 5,453,406 | 9/1995 | Chen | 438/782 |
| 5,454,901 | 10/1995 | Tsuji | 156/643.1 |
| 5,462,898 | 10/1995 | Chen et al. | 437/235 |
| 5,470,798 | 11/1995 | Ouellet | 438/785 |
| 5,543,352 | 8/1996 | Ohtani et al. | 437/101 |

FOREIGN PATENT DOCUMENTS

| | | |
|---|---|---|
| 3023201 | 1/1982 | Germany . |
| 60-136310 | 7/1985 | Japan . |
| 6-157875 | 6/1994 | Japan . |
| 94 14188 | 6/1994 | WIPO . |

OTHER PUBLICATIONS

Bergmann, Guido, "Investigations on the Qualification of Doped Poly(Methylmethacrylate) as a Resist for x–ray Deep Lithography", Univ. Bonn, Phys. Inst., [Tech. Rep] Bonn–IR (1989), Bonn–IR–89–49, 91 pp.

(List continued on next page.)

*Primary Examiner*—Tuan H. Nguyen
*Assistant Examiner*—Matthew Whipple
*Attorney, Agent, or Firm*—Venable; Norman N. Kunitz; Ashley J. Wells

[57] ABSTRACT

The reduction of surface recombination is required for the manufacture of electronic devices made of silicon as well as for the application of various measurements and analytical methods for determining the purity of silicon. According to this invention, a process will be described for applying a laquer layer to the surface of silicon wafers, wherby the surface recombination velocity will be reduced to a value below 100 cm/s.

12 Claims, 7 Drawing Sheets

(6 of 7 Drawing(s) in Color)

OTHER PUBLICATIONS

Veno, T "Resist Materials Utilizing Oxygen Plasma Resistance of Iodine Compounds", Proc.–Electrochem. Soc(1985) 258–69; ISSN 0161–6374.

Wolf, Stanley Silicon Processing For The VLSI Era, vol. 1, pp. 418,419,429–434, (1986).

CAS/STN Resistry. "Alftalat/CN".

Wolf, Stanley "Silicon Processing For The VLSI Era" vol. 1, pp. 516–517 (1986).

Webster II New Riverside Dictionary (1984) p. 672.

Extended Abstracts, vol. 93–2, Fall Meeting, New Orleans Louisiana, Oct. 10–15, 1993; The Electrochemical Society, Inc., pp. ii, xxix, 505, 506, no month.

Msaad et al.: "Electronic Passivation of Silicon Surfaces by Halogens". In: Journal of Electronic Materials, vol. 23, No. 5, 1994, pp. 487–491, no month.

Msaad et al.; conference preprint. "Electronic Passivation of Silicaon Surface of Halogens." pp. 1–16, no month.

PROCESS FOR REDUCING THE SURFACE RECOMBINATION SPEED IN SILICON

BACKGROUND OF THE INVENTION

This invention concerns a process for reducing the surface recombination velocity of silicon wafers.

When manufacturing electronic devices from silicon, a procedure for reducing surface recombination will usually be required for their functioning as well as for the application of various measurements and analytical methods. In particular, this is true for determining bulk recombination lifetime—which is a measure for the purity of silicon with regard to electrically active impurities. However, for the determination of this bulk recombination lifetime a necessary condition is that the smallest dimension of the sample must exceed four times the diffusion length of the free charge carriers. Generally, this requirement is not met by standard silicon wafers as their thickness is usually less than the diffusion length of the charge carriers. Only if the surface recombination velocity becomes sufficiently low, that is below 100 cm/s, will it be possible to measure bulk lifetime on standard silicon wafers with sufficient precision to monitor the purity of silicon wafers before and after technological processes for the device production.

A reduction of the surface recombination velocity in silicon can be achieved by thermally growing a silicon dioxide ($SiO_2$) layer in an oxidizing atmosphere at temperatures in the range of about 800–1200° C. In the literature, and in common usage, such layers are also frequently designated by the more comprehensive heading "surface passivation". In general, surface passivation also includes the additional aspect of "protection against environmental influences". Due to the excellent mechanical, chemical, and electronic properties of the $SiO_2$ layer, today this type of layer is used in almost all areas of silicon semiconductor technology.

Figure 5A:
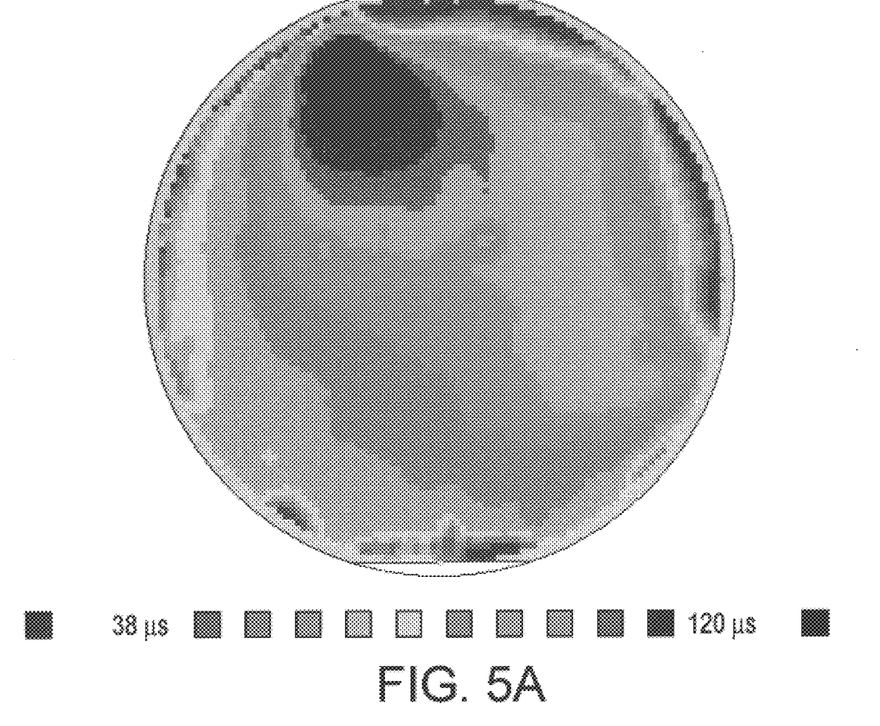
FIG. 5 shows the resultant distribution of lifetime values of the silicon wafer.
Figure 5B:
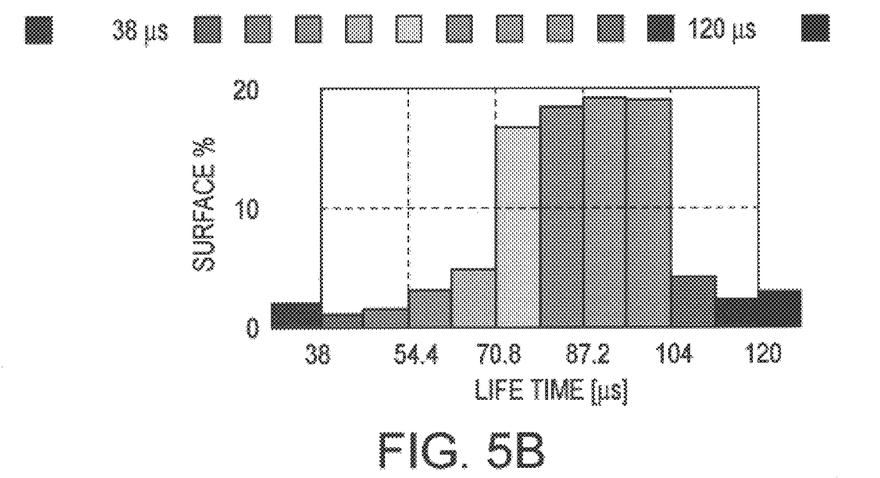

However, there are some applications where this type of layer cannot be used with satisfactory results. On the one hand, this is the case for devices which cannot withstand the high temperature-time stress occurring during the growth of this layer. Another case is the measurement of bulk lifetime in order to detect heavy metals in Si wafers in the ppb range. Here it is very difficult, or even impossible to quantify how oxidation will influence the heavy metal content of the wafer by additional contamination, or segregation, precipitation, and evaporation. On the one hand, depending on the ratio of contamination levels of wafer and oxidation furnace, contamination from the tube may diffuse into the wafer to be examined. But, on the other hand, it is also possible that contamination will outdiffuse from the wafer and accumulate in the oxide or precipitate homogenously or heterogenously. In all these cases mentioned above, carrier lifetime measured subsequently no longer represents the original impurity level of the wafer. A further problem with thermal oxidation is the poor reproducibility of the density of states at the interface Si—$SiO_2$, which determines the surface recombination velocity. FIG. 5 illustrates the lifetime distribution of a thermally oxidized wafer, with a low average lifetime of 85.84 µs, which is mainly determined by the recombination at the Si—$SiO_2$ interface.

To overcome the problem of thermal stress, there is the possibility of using a $SiO_2$ layer deposited by the CVD (Chemical Vapor Deposition) process or one of its variants—PECVD (Plasma Enhanced CVD) or Photo CVD—instead of the thermally grown oxide layer. Depending on the process used, temperatures from approximately 100° C. to 900° C. are applied. A further advantage of these processes is that even layers such as silicon nitride $Si_3N_4$ or silicon oxinitride $SiO_xN_y$, can be deposited.

A serious disadvantage of these known deposited CVD layers is their poor ability to decrease the surface recombination velocity. Therefore they belong to the passivation layers in an extended sense, where the aspect "protection against environmental influences" takes precedence. For device applications, these layers will be used only in connection with a thin thermal $SiO_2$ layer grown directly onto the silicon surface. For the same reason, and due to the fact that there are equipment specific contamination problems, so far no relevant analytical applications are known.

The analytical application is further complicated by the fact that the diffusion coefficients of the impurity metals of interest in Si are mostly some orders of magnitude higher than those of the doping elements P, B, As, and Sb. Therefore temperature-time stress, which is tolerable even for highly sensitive devices, can cause unpredictable changes in the contamination level, as already mentioned in the context of thermal oxidation.

Furthermore, it is known that hydrogen and halogens (F, Cl, Br, J, and At) present at the Si surface will reduce surface recombination velocity. This can be achieved, for instance, by treating the Si surface with hydrofluoric acid (HF). A serious disadvantage of this method is that the reduction of surface recombination disapears under the influence of atmospheric oxygen within a few minutes after removing the wafer from the liquid. This precludes any device application. A known application in the analytical area is the "Elymat Method" for measuring charge carrier diffusion length in Si wafers. Here, the wafer is placed inside a cuvette containing diluted HF during the measurement. Due to the hazards involved in handling HF, a rather large technical expense is required to reduce risks for the operating personnel.

A method which has become known more recently is to put the Si surfaces, freshly etched with HF, into an alcoholic iodine or bromine solution, as described e.g. by H. Msaad, J. Michel, J. J. Lappe and L. C. Kimmerling in "Electronic Passivation of Silicon Surfaces by Halogens" (to be published in "Journal of the Electrochemical Society" 1994). There, surface recombination velocities of less than 1 cm/s are achieved, which is an excellent value compared to about 100 cm/s achieved by thermal $SiO_2$. A disadvantage of this method—just as with the previous one—is that the effect remains stable only as long as the wafer remains in the solution. An advantage is the considerably lower hazard potential involved in handling an alcoholic iodine solution, compared to HF. Nevertheless, handling the liquid involves a substantial additional effort.

SUMMARY OF THE INVENTION

The object of the invention is to provide a simple-to-implement process enabling the surface recombination velocity of silicon to be reduced to values less or equal 100 cm/s, and which also allows easy handling of Si devices or Si wafers treated with this process.

According to the invention there are the following steps:

First, the Si surface will be cleaned as each Si surface usually exhibits a silicon dioxide layer ($SiO_2$) approximately 2 to 4 nm in thickness. Preferably, this $SiO_2$ layer can be removed by hydrofluoric acid (HF). After drying the Si surface, a lacquer will be applied to the surface of the Si wafer at a temperature of less than 100° C., preferably at ambient temperature, so that when this lacquer dries an electrically non-conducting layer is formed. This lacquer may be applied, for example, by spraying, spinning, painting, or even by dipping.

Depending on the type of lacquer used, the drying process will lead to a consolidation of the lacquer as, for instance, a solvent present in the lacquer will evaporate, and optionally and additionally a chemical reaction with a reacting partner from the layer or ambient atmosphere (such as atmospheric oxygen, humid air) will cause a gel to form or a change in the physical condition to occur, or cooling will convert lacquer applied at a temperature above ambient temperature into a firm layer. For analytical use of the process according to this invention, i.e. to measure the carrier lifetime of standard Si wafers, the applied layer must be transparent for the laser beam used to carry out measurements, e.g. in the 900 nm range.

By this manner, surface recombination velocity will be reduced to less than 100 cm/s without a noticeable temperature stress occurring in the Si wafer or the Si semiconductor devices. This value is sufficiently small for the functioning of semiconductor devices as well as for the use of analytical methods such as the measurement of charge carrier lifetime in Si wafers to monitor contamination with heavy metals such as iron or gold.

Preferably, a material based on an organic substance may be used as lacquer, such as a natural or synthetic resin which will further contain a halogen as an additive, preferably iodine. Preferably, particularly good results were achieved by using iodine added to colophony, which is extracted from balsam resin, root resin, or tall resin. Equally good results are obtained by a lacquer based on the alkyd resin group of substances, such as alftalat. Furthermore, it has been shown that even a physically drying clear or transparent lacquer will give the desired results such as Zapon enamel which is based on cellulose nitrate.

Finally, using polysiloxans such as silicon lacquer will also yield useable results.

The file of this patent contains at least one drawing executed in color.

BRIEF DESCRIPTION OF THE DRAWINGS

Using implementation examples, the process according to this invention is to be illustrated and explained below with reference to the drawings wherein.

DESCRIPTION OF THE PREFERRED EMBODIMENTS

A first implementation example concerns the measurement of charge carrier lifetime on Si wafers according to the $\mu$PCD method (Microwave Photoconductive Decay) for monitoring contamination with electrically active metals such as iron or gold. To remove oxide layers from the surface, the wafer to be examined will be placed in hydrofluoric acid. After all oxide residues have been removed, detectable by the surface becoming hydrophobe, the wafer will be thoroughly rinsed in de-ionized water and then blown dry with nitrogen. Then, for example, the wafer will be sprayed on both sides, with a spray can containing a trade standard soldering lacquer based on colophony with additives containing halogens such as fluorine, with CFC propellant gas and at ambient temperature. After this layer is dry to the touch, the wafer will be placed into a magazine, and this will in turn be placed inside a measurement apparatus.

Figure 1A:
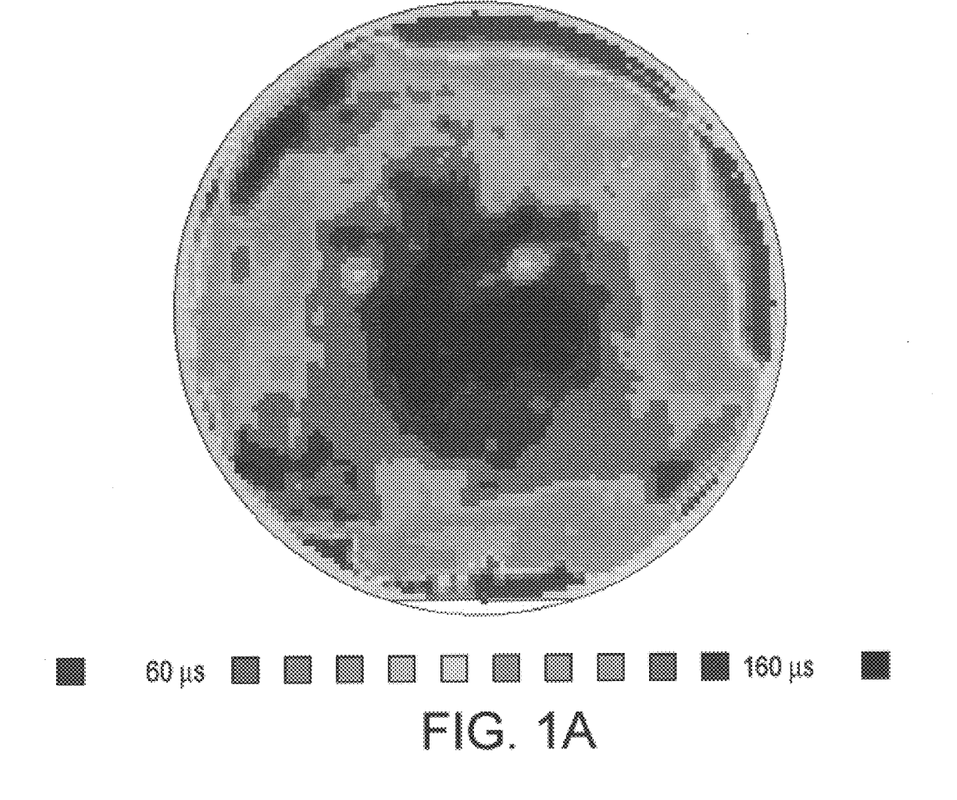
FIG. 1 shows the local distribution of minority carrier lifetime of silicon wafer treated by the process according to this invention.
Figure 1B:
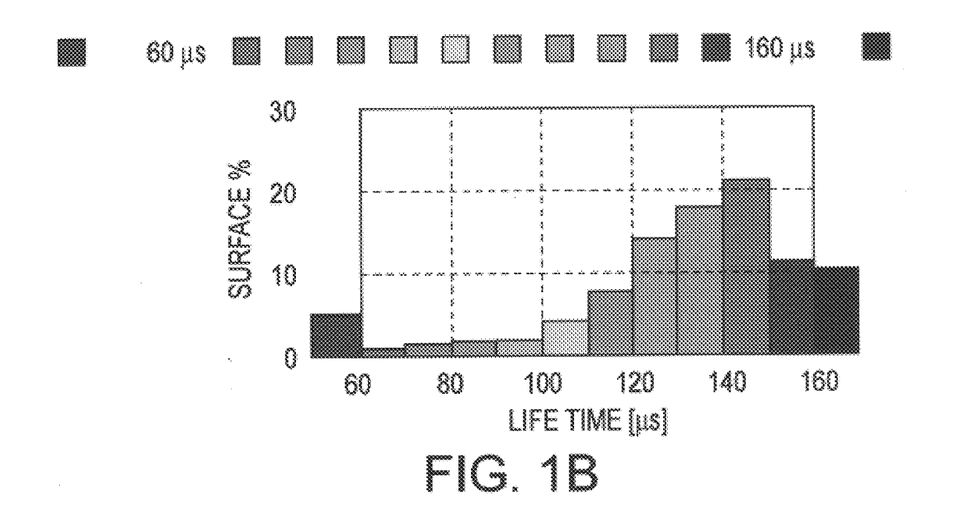

FIG. 1 illustrates the local distribution of the lifetime values for such a silicon wafer; for the purpose of comparison, the same Si wafer had been thermally oxidized previously and measured. The resultant distribution of lifetime values is shown in FIG. 5. This comparison shows substantially higher values for the Si wafer treated by means of the process according to this invention than for the Si wafer with an oxidated surface. FIG. 1 yields a mean value of 130.1 $\mu$s, compared to a mean value of just 85.84 $\mu$s according to FIG. 5.

Figure 2A:
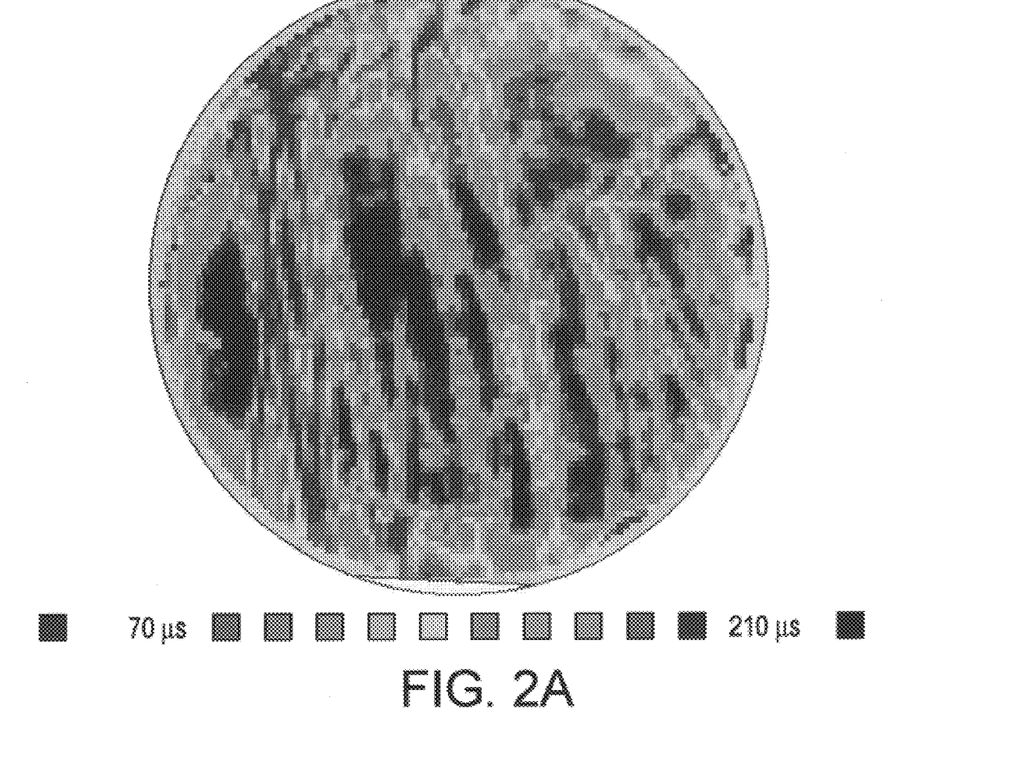
FIG. 2 shows the local distribution of minority carrier lifetime of a further silicon wafer treated by the process according to this invention.
Figure 2B:
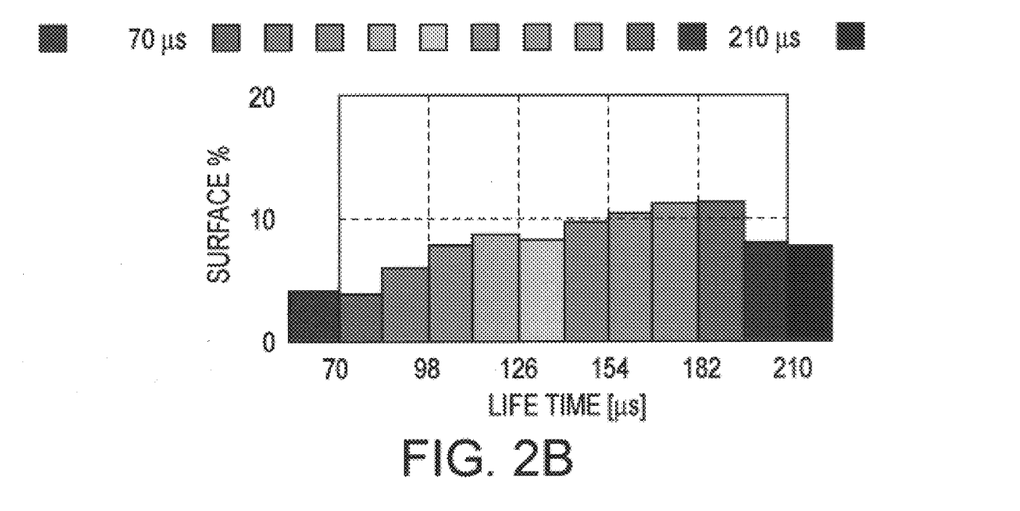
Figure 6A:
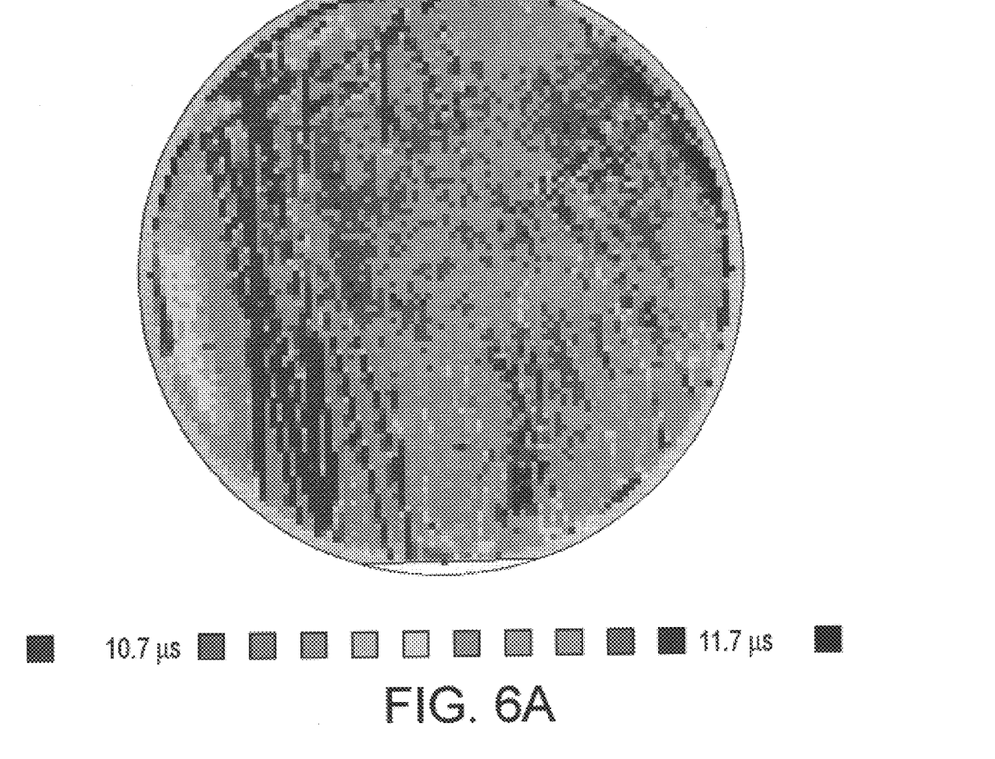
FIG. 6 shows the lifetime value of a silicon wafer contaminated by traces of iron.
Figure 6B:
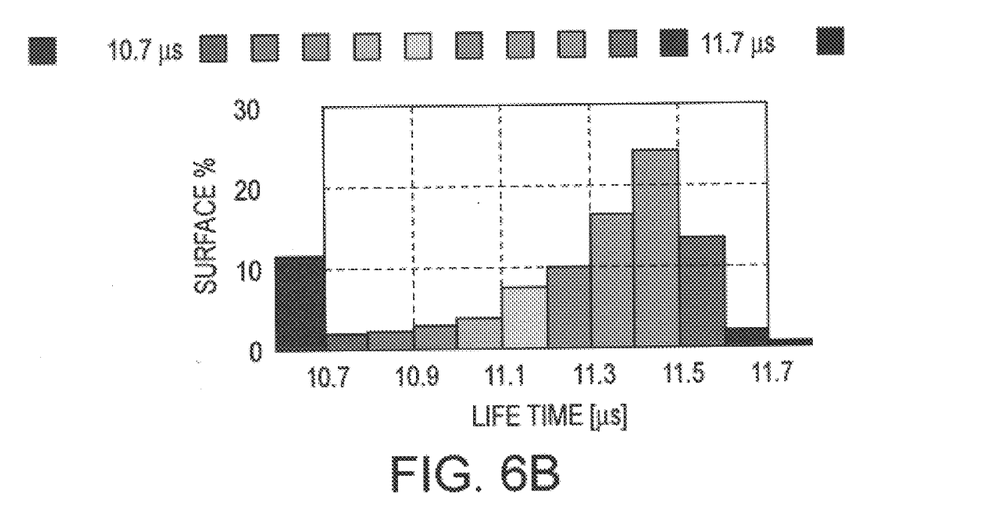

In a further implementation example, an Si wafer was used which had been contaminated by traces of iron due to some defective equipment. FIG. 6 illustrates the lifetime values of this Si wafer, which has as surface passivation the so-called natural ambient oxide only; for this reason, the mean value is very low, namely 11.2 $\mu$s. If the same wafer is treated according to the first implementation example, the lifetime distribution according to FIG. 2 results; this shows substantially higher lifetime values, namely a mean value of 150.1 $\mu$s. FIGS. 2 and 6 both show the same contours indicating contamination; because of the greater diffusion length of the minority carriers due to the longer effective lifetime, however, the contours in FIG. 2 are significantly less sharply delimited.

Figure 3A:
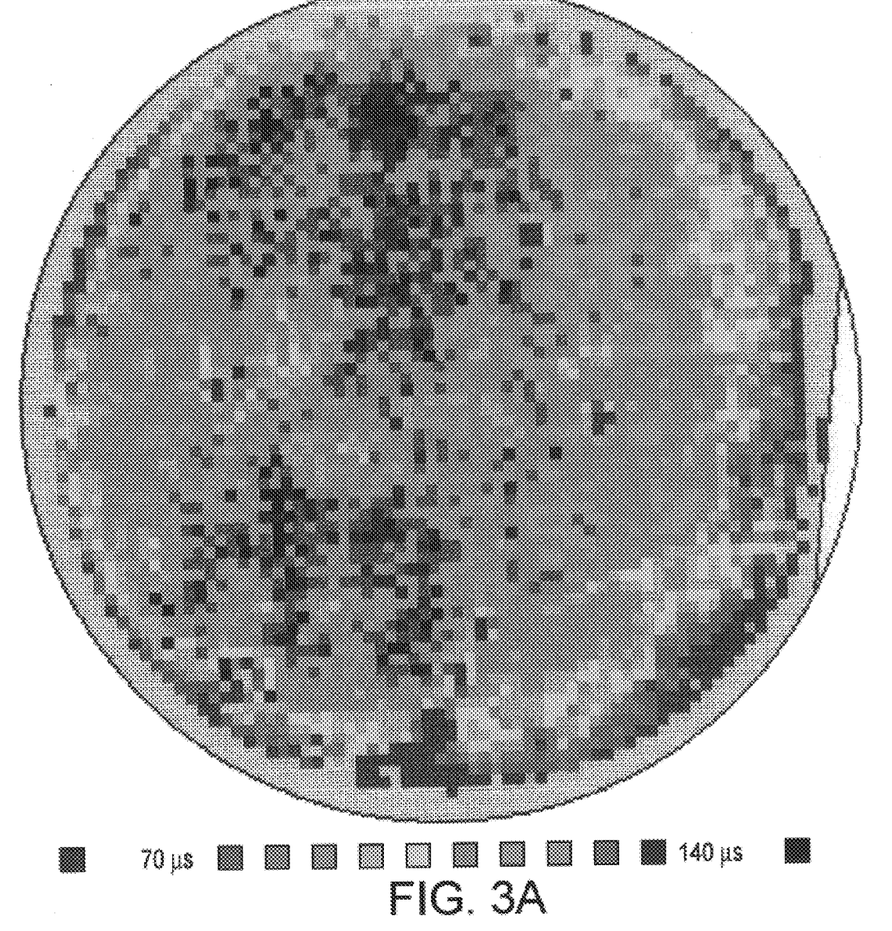
FIG. 3 shows the local distribution of minority carrier lifetime of a further silicon wafer treated by the process according to this invention.
Figure 3B:
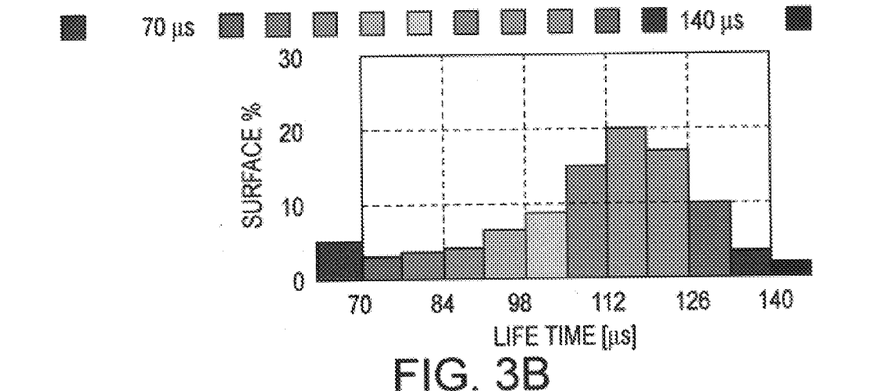
Figure 7A:
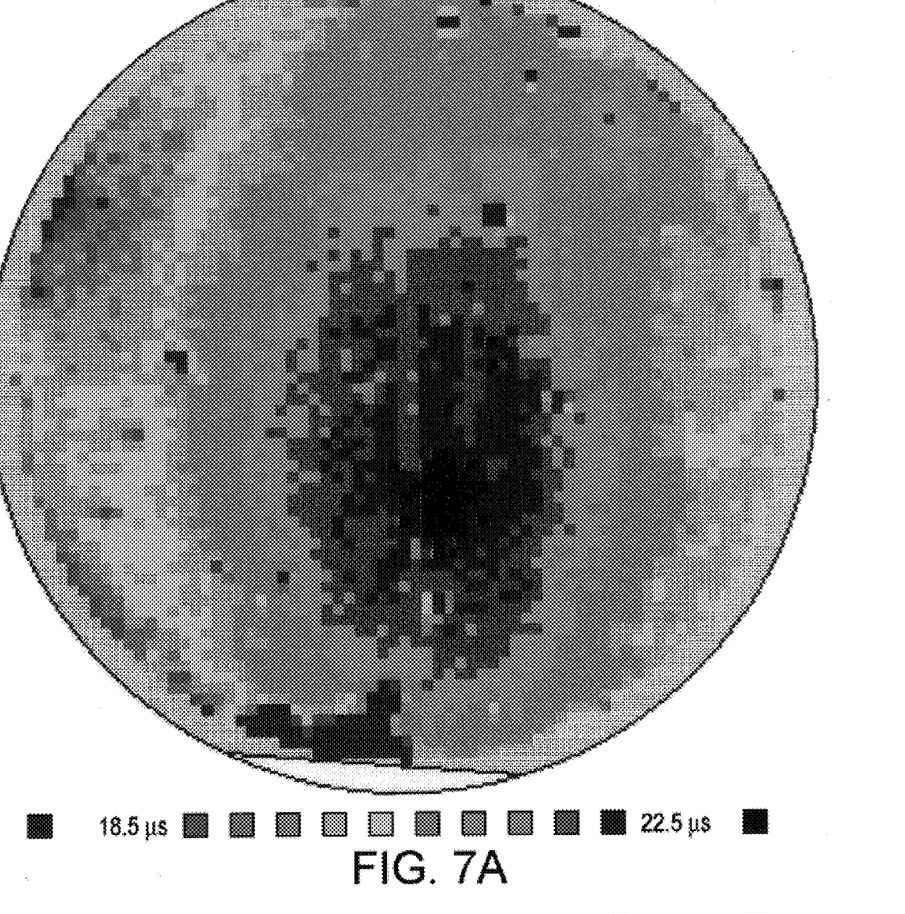
FIG. 7 shows the resulting lifetime values of the silicon wafer with thermal $SiO_2$ passivation.
Figure 7B:
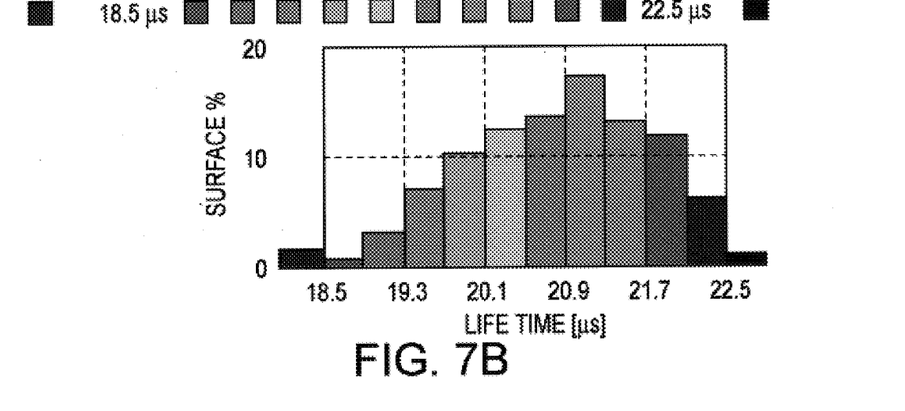

In a third implementation example for surface treatment of an Si wafer, a solution consisting of 73.75 g isopropanol, 25 g colophony, and 1.25 g iodine will be prepared. The wafer to be examined will first be etched in a mixture of HF:HNO. This will remove approximately 1 $\mu$m of silicon. As described above, the wafer will then be etched in HF, thoroughly rinsed, and dried. Then, this wafer will be coated on both sides, by brush application at ambient temperature, with the prepared solution. After this layer is dry to the touch, the wafer will be placed inside the measurement apparatus. The resulting lifetime values are shown in FIG. 3; they are all higher than the values given by the same wafer measured previously with thermal $SiO_2$ passivation, as shown in FIG. 7. Thus, according to FIG. 7, the mean value is 20.75 $\mu$s only—which same mean value will have risen to 109.3 $\mu$s according to FIG. 3. This indicates an increased reduction in surface recombination, which in turn means that the value of real interest here—volume lifetime—is more precisely determined.

Instead of the lacquers stated in the first and third implementation examples, alftalat, Zapon lacquer, or silicon lacquer may also be used.

The process according to this invention can be advantageously used for reducing surface recombination velocity when manufacturing silicon devices.

Figure 4:
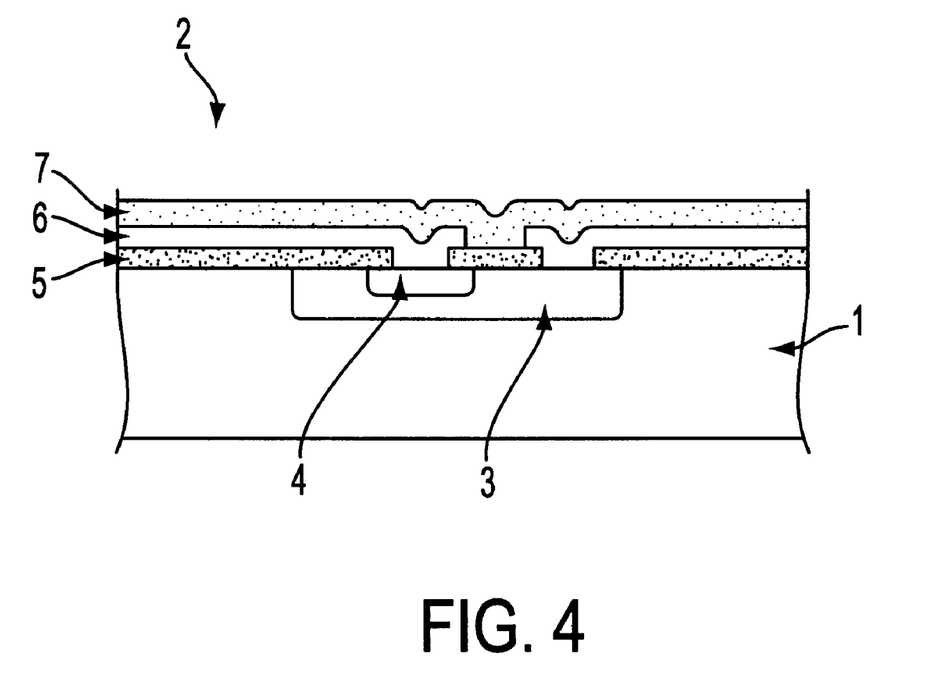
FIG. 4 shows a cross-section schematic of a silicon device treated by the process according to this invention.

In this connection, FIG. 4 shows a section from an Si wafer 1 into which components such as a transistor 2, complete with base zone 3 and emitter zone 4, has been integrated. Following manufacture of these zones, a layer 5 will be applied to the Si surface, which layer will be generated, for example, according to the first or third implementation example above and lead, to a surface recombination velocity below 100 cm/s. Then, this layer 5 will be structured by means of known methods in order to generate a circuit structure 6 on this layer, e.g., from aluminum. Finally, a passivation layer 7 will be deposited, e.g., from polyimide. Instead of such a polyimide layer, a layer generated according to the first or third implementation example may also be used.

The advantage of using the layer according to this invention for reducing surface recombination velocity in connection with the manufacture of Si semiconductor devices is that this layer can be generated at temperatures below 100° C., in particular at ambient temperature levels, resulting in low temperature stress for the subject device.

What is claimed is:

1. A process for measuring minority carrier lifetime in a silicon wafer having a reduced surface recombination velocity of charge carriers within the silicon wafer, comprising:
   a. reducing surface recombination velocity of charge carriers within the silicon wafer by maintaining temperature below 100° C. while performing the steps of:
      i. cleaning the surface of the silicon wafer to remove oxide therefrom;
      ii. drying the silicon wafer by blowing a non-oxidizing gas thereon;
      iii. directly applying a layer of lacquer onto the surface at a temperature below 100° C., which lacquer comprised an organic material which dries by a process selected from the group consisting essentially of (i) solvent evaporation and (ii) solvent evaporation and chemical reaction; and
      iv. drying the layer of lacquer at a temperature below 100° C. to generate an electrically non-conducting layer and reduce the surface recombination velocity of charge carriers within the silicon wafer; and
   b. measuring minority carrier lifetime while the lacquer is on the silicon wafer.

2. The process according to claim 1, wherein the surface recombination velocity of charge carriers within the silicon wafer is reduced to a value which does not exceed 100 cm/s.

3. The process according to claim 1, wherein the layer of lacquer is applied at an ambient temperature of about 25° C.

4. The process according to claim 1, wherein cleaning the silicon surface to remove oxide therefrom is accomplished by placing the silicon wafer in hydrofluoric acid followed by rinsing with water, and wherein the non-oxidizing gas used to dry the oxide-free surface is nitrogen.

5. The process according to claim 1, wherein the organic material is selected from the group consisting of a natural resin, cellulose nitrate, an alkyd resin, and a polysiloxane.

6. The process according to claim 5, wherein the layer of lacquer contains halogen in a concentration of more than 0.1 volume %.

7. The process according to claim 6, wherein the halogen is iodine.

8. The process according to claim 6, wherein a further layer is applied to the layer of lacquer as a passivation layer.

9. The process according to claim 8, wherein the further layer is a transparent non-conducting film.

10. The process according to claim 5, wherein the natural resin is colophony.

11. The process according to claim 5, wherein the alkyd resin is alftalat.

12. The process according to claim 1, wherein the layer of lacquer is a transparent layer.

* * * * *